United States Patent [19]

Grossa

[11] Patent Number: 5,147,743
[45] Date of Patent: Sep. 15, 1992

[54] PROCESS FOR THE PREPARATION OF OPTICAL COLOR FILTERS

[75] Inventor: Mario Grossa, Dreieich, Fed. Rep. of Germany

[73] Assignee: E. I. Du Pont de Nemours and Company, Wilmington, Del.

[21] Appl. No.: 545,045

[22] Filed: Jun. 28, 1990

[51] Int. Cl.⁵ .............................................. G03C 5/00
[52] U.S. Cl. ......................................... 430/7; 430/28; 430/330; 430/350; 430/353; 430/965
[58] Field of Search .................... 430/7, 330, 350, 353, 430/465, 28; 350/311

[56] References Cited

U.S. PATENT DOCUMENTS

| | | | |
|---|---|---|---|
| 4,243,741 | 1/1981 | Abele et al. | 430/270 |
| 4,346,162 | 8/1982 | Abele | 430/270 |
| 4,503,134 | 3/1985 | Matsumoto et al. | 430/7 |
| 4,604,340 | 8/1986 | Grossa . | |
| 4,716,095 | 12/1987 | Grossa . | |
| 4,869,996 | 9/1989 | McCartin et al. . | |
| 5,001,031 | 3/1991 | Tamamoto et al. | 430/109 |

Primary Examiner—Charles L. Bowers, Jr.
Assistant Examiner—Thorl Chea

[57] ABSTRACT

A process for the preparation of a color filter is described utilizing an exposure step of a light-sensitive material, imagewise exposing, toning and heat treating.

14 Claims, No Drawings

PROCESS FOR THE PREPARATION OF OPTICAL COLOR FILTERS

BACKGROUND OF THE INVENTION

The subject of the invention is a process for the preparation of any type of patterned, monochromatic or polychromatic, optical color filter, such as is used, for example, for color separation in devices for making color images or particularly in systems for the reproduction of such images (displays).

Most of such color filters are finely patterned, that is, the structural elements are often only a few microns large. Depending on the use, these elements are in the form of stripes, circles or other geometric figures. Most are required for filters with closely adjoining areas of different colors.

Many processes are known for the preparation of such color filters. The methods used include screen printing, color photography based on silver halides, diazo processes, the transfer of preformed polychromatic patterns onto a common substrate, imagewise ablation of color layers by laser, washoff after photocrosslinking, applying color to lithographically formed patterns from colorless binders, and others.

Similarly known are processes in which finely divided dyes or dyed compositions are coated in the form of the desired pattern onto the substrate. Thus, European Patents 01 13 237 and 01 57 486 disclose the preparation first of a patterned, conductive layer on an insulating substrate and then coating electrophoretically on the conductive areas a dyed polymer layer from an aqueous solution containing a polymer and a dye. Various conductive areas insulated from one another can be provided successively with coatings of various colors in suitable electrophoretic baths. If the conductive areas are later to serve as electrodes in liquid crystal cells, then the electrical field is partially shielded by the polymer layer, which decreases the sensitivity of the cell.

German Patents 27 58 209 and 24 29 615 disclose negative-working light-sensitive layers, the exposed areas of which are tonable with a powdered color to produce an image. The layers described therein can also contain a plasticizer. The use of negative-working layers for polychromatic images offers the advantage that, in the first step, the unexposed and untoned areas retain their light-sensitivity and can be toned in a succeeding step with another color after exposure of another pattern. This process can be repeated until the entire layer is toned. However, patterns prepared by this process on transparent supports are not suitable as color filters, because they scatter too much light. In addition, they are unstable to many solvents, so that further processing to liquid crystal cells, for example, the application of equalizing layers, is possible only with limitations.

The problem involved in the invention is the development of a process in which color filters with low light scatter and good stability to mechanical and chemical stresses can be prepared in a simple manner by the use of negative-working, light-sensitive, tonable layers.

SUMMARY OF THE INVENTION

The present invention is directed to a process for the preparation of a monochromatic or polychromatic color filter by
(a) applying a negative-working, light-sensitive, tonable layer onto a transparent support,
(b) imagewise exposing in a pattern corresponding to a spatial configuration of a filter element color,
(c) toning the layer with a colored toner,
(d) subjecting the toned layer to a heat treatment.

DESCRIPTION OF THE INVENTION

Negative-working, light-sensitive layers with 1,4-dihydropyridine compounds, as are described, for example, in German Patents 27 58 209 and 34 29 615, are preferred for performing the process of the invention. Compounds of 2'-nitrophenol-1,4-dihydropyridine, for example, the compounds cited on page 3, lines 51 to 60 of German Patent 34 29 615, are preferred. These compounds can be coated on transparent supports by a conventional coating process, for example, spin coating, singly or as mutual mixtures, either as such or dissolved in a volatile solvent.

The light-sensitive layers can also be prepared from 1,4-dihydropyridines mixed with hexaaryl bisimidazoles. Suitable compounds are listed in Tables I and II of German Patent 27 58 209.

The light-sensitive layers can contain plasticizers compatible with the toner binder. Examples of suitable plasticizers are esters of aliphatic or aromatic di-, tri-, and tetracarboxylic acids with two to four carbon atoms and monofunctional alcohols with 1 to 20 carbon atoms, esters of di-, tri-, and tetrafunctional alcohols with 2 to 20 carbon atoms and aliphatic or aromatic monocarboxylic acids with 4 to 12 carbon atoms, and ethers of any of the cited polyfunctional alcohols with the cited monofunctional alcohols. Examples are diisobutyl phthalate, dibutyl adipate, dibutyl glycol, and trioctyl mellitate. The necessary quantity of plasticizer can be determined by test; it is generally between 2 and 15 percent by weight of the dry portion of the light-sensitive layer.

Satisfactory results are obtained without a particular plasticizer with certain combinations of light-sensitive material and toner binder, for example, dihydropyridine compounds, particularly 2'-nitrophenyl-1,5-dihydropyridine derivatives, preferably the ester of 2'-nitrophenyl-1,5-dihydropyridine-3,5-dicarboxylic acid and cellulose acetate, polymethyl methacrylate or polyalpha-methyl styrene. In this case, it is assumed that the light-sensitive material itself or its photolysis products act simultaneously as plasticizers. Thus, the plasticizers are present in the layer only after imagewise exposure. Consequently, with such systems, the whole surface of the backside of the toned, light-sensitive layer is exposed through the transparent support to increase plasticizer concentration in the layer.

It is not absolutely necessary to add high molecular weight binders to the light-sensitive layers. Adhesion of the filter areas of the invention to the support is generally adequate without a binder.

The thickness of the light-sensitive layer can be selected freely within certain limits. Consideration should be given to the fact that thicker layers have lower resolution capability, whereas thinner layers have lower color density. Good results are generally obtained with layers 0.5 to 5 microns thick.

The toners to be used in the invention contain requisite color agents (pigments or dyes), which can be selected according to the desired properties of the color filter. Suitable color agents are cited, for example, on page 5, lines 57 onwards in German Patent 29 45 564. Furthermore, it is advantageous for the toners to contain a thermoplastic binder, which must be compatible with the plasticizer of the light-sensitive layer. Suitable examples thereof are polyvinyl chloride, polyvinyl alcohol, polystyrene, and vinyl chloride/vinyl acetate copolymers; cellulose acetate, poly-alpha-methyl styrene and polymethyl methacrylate are preferred. If polyamide acids are used as binders for the toner, the subsequent heat treatment results in very resistant, chemically and mechanically, filter elements as a result of conversion to polyimides. If the color agent itself is fusible or is thermoplastic without decomposition, the toner does not need a binder. The toners are used in the form of powders with a particle size between 0.2 and 30 microns and preferably with at least 50% of the particles having a spherical diameter between 2 and 10 microns. Use can also be made of toners specified for electrostatic copying processes with thermal fixing.

For the preparation of filters by the process of the invention, a pattern in the form of the desired filter element of one color is exposed through an appropriate mask on the light-sensitive layer of the transparent support and toned with the corresponding colored toner powder. This toning can be accomplished by various known methods, for example, with a pad or a brush, by strewing the powder and letting it trickle off, optionally with the support being vibrated, or by contact with an auxiliary surface on which the toner powder is loosely bonded. The pattern can also be toned with the aid of a color-bearing transfer layer, for example, in accordance with German Patents 29 49 462 or 36 25 014. The light-sensitive layer is brought into contact with the transfer layer, optionally with the application of heat and pressure, and then peeled away. These process steps of exposure and toning are repeated for each color.

In many instances, it is necessary to have on the support, in addition to the color areas, achromatic, highly light-absorbing areas that form a so-called black matrix. Such a matrix can be prepared like the filter element by exposing a pattern and toning with a toner containing a black color agent. Preferably, this is done in a first step before the preparation of the color filter.

It is advantageous to treat light-sensitive layers containing dihydropyridines with a strong acid after each toning, as described in German Patent 35 40 804. This prevents areas colored with a specific toner from being contaminated with other colors in subsequent toning steps.

Whenever all of the desired colors are applied, the system of support, light-sensitive layer, and toners that have been applied patternwise is subjected to a heat treatment. This accomplishes two objectives. First, the light-sensitive layer's volatile portion, which is no longer needed and which could adversely affect the characteristics of the finished display, is volatilized. Second, the toner particles coalesce and the filter elements lose most of the disrupting property of high light scattering. In addition, the filter elements become significantly more stable to solvents used in further processing, for example, phenoxy ethanol or N-methyl pyrrolidone.

Heat treatment is accomplished at the lowest possible temperature, preferably below 240° C. Its duration is preferably 10 to 60 minutes. However, duration and temperature should always be selected so that no visible decomposition of the support and toners occurs.

It is not completely clear why the heat treatment results in such a sharp reduction of light scattering in the toned filter elements It is assumed that the number of scattering interfaces is drastically reduced by the coalescence of the toner particles. However, it is surprising that this effect doe snot occur if the toner particles actually melt. The effect of the invention is observed even if the toner contains only such color agents and binders that cannot melt at the temperature of the heat treatment, as well as if the polymer binder of the toner has a melting point lower than this temperature. It is similarly surprising that performing the process of the invention does not produce a noticeable change in the form of the filter elements. This applies independently of whether the toner contains components that melt at the temperature of the heat treatment.

In a particularly preferred embodiment of the process of the invention, light scattering by the filter elements can be reduced even further. For this, the finished filter after heat treatment is placed in a solvent selected according to the characteristics of the toner binder. In the case of cellulose acetate toners, good results are obtained with acetone. Butanone and dichloromethane are also suitable. The solvent is used preferably in the vapor phase.

The color filters of the invention generally do not have completely flat surfaces, because the filters consist of individual, adjoining polychromatic areas adhering to the substrate. However, they can be coated by a simple method with an equalizing layer of polyimide. A solution of the polyimide in a suitable solvent, for example, phenoxy ethanol, can be applied and dried. Such a coating is needed anyway as the socalled orientation coating in liquid crystal displays. In another version, a patterned, conductive layer, for example, of indium tin oxide, can be coated on this layer to serve as the control electrode in the display.

The process of the invention is different from the state of the art in that it can be performed simply and inexpensively. Thus, for example, only one light-sensitive layer is required. Special measures to insure dimensional stability, like those necessary with transfer layers, are eliminated, because the colored filter elements are produced directly on the support. The hue of the filter elements can be matched to the goal value by choice of color agent or also by simple mixture of different toners. Color density can also be controlled in a simple manner, for example, by the exposure.

The color filters prepared in the invention are outstandingly suitable for incorporation in liquid crystal displays. They have accurate dimensions, very uniform layer thickness, and are compatible with solvents and assembly materials. Pigments with improved aging stability can be used, because the type of color agent can be selected freely within wide limits. The low scattering of the filter elements requires high contrast in the finished display, because the light becomes only very slightly depolarized in the filter elements.

The invention can be used to prepare color filter elements for devices that are specified for reproducing or recording monochromatic or polychromatic images, for example, video cameras. To further illustrate the present invention the following examples are presented.

EXAMPLE 1

A glass plate was coated with a solution of 3.75 g dimethyl ester of 2,6-dimethyl-4-(2'-nitrophenyl)-1,4-dihydropyridine-3,5-dicarboxylic acid and 11.25 g diethyl ester of 2,6-dimethyl-4-(2'-nitrophenyl)-1,4-dihydropyridine-3,5-dicarboxylic acid in 190 ml methyl ethyl ketone and dried. The dried layer was 1.2 microns thick. It was exposed at 160 mJ/cm$^2$ through a mask with clear, square areas of 250 microns in size by means of a 1000 watt mercury vapor lamp provided with a filter having maximum transparency at 360 nm. Because the light-sensitive layer was slightly tacky, direct contact with the mask was avoided.

The exposed layer was toned with a cellulose acetate powder (54% acetylated, two microns average particle size) incorporating 30 percent by weight particles of Perylene Pigment Red 123 (CAS Number 24108-89-2), and excess toner was wiped off with a dust cloth.

For the determination of scattering behavior, the glass plate with the filter element pattern was laid on the stage of an overhead projector. The filter elements appeared black in the projection without a noticeable polychromatic portion.

Now, the glass plate was heated in an oven for 60 minutes at 225° C. After the plate was cooled, the test was repeated with the overhead projector. The filter elements now appeared brown in the projection.

Finally, the plate was placed in a covered beaker for 10 minutes over acetone at a temperature of 50° C. The test in the projector now showed a slightly blackened red color.

EXAMPLE 2

Example 1 was repeated, except that the toner was a preparation from 18 parts by weight Pigment Blue 15:4 (CAS Number 147-14-8) and 82 parts by weight polymethyl methacrylate with a glass transition temperature of 105° C. ("Elvacite" 2008 from the Du Pont Company). Although testing the freshly prepared filter element in the overhead projector showed a black image, a pure blue green projection was observed after a heat treatment for 60 minutes at 225° C.

EXAMPLE 3

Example 2 was repeated, except that the toner contained poly-alpha-methyl styrene as a polymeric binder, instead of polymethyl methacrylate. Here, too, a pure blue green image was observed in the projection after the heat treatment.

EXAMPLE 4

Example 2 was repeated, except that, instead of polymethyl methacrylate, the toner contained a binder of a copolymer of alpha-methyl styrene and vinyl toluene with a softening temperature of 100° C.

EXAMPLE 5

Example 4 was repeated, except that the exposure was at 240 mJ/cm$^2$. Color filter elements were obtained with a visually obvious, higher color density. This was also shown by a 65% transmission at 500 nm (instead of 75% as in Example 4), as measured by a spectrophotometer.

EXAMPLE 6

Example 3 was repeated, except that, before the heat treatment, the light-sensitive, toned layer was exposed through the glass plate at 500 mJ/cm$^2$. After the heat treatment, the filter elements showed a pure, blue green image on projection.

What is claimed is:
1. A process for the preparation of a monochromatic or polychromatic color filter by
   (a) applying a negative-working, light-sensitive, tonable layer onto a transparent support,
   (b) imagewise exposing in a pattern corresponding to a spatial configuration of a filter element color,
   (c) toning the layer with colored toner present as a coalescible powder,
   (d) subjecting the toned layer to a heat treatment wherein said heat treatment consists essentially of heating at a temperature below 240° C. and wherein said heating coalesces the colored toner powder.
2. The process of claim 1 wherein steps (b) and (c) are repeated with a pattern corresponding to a spatial configuration of a filter element of another color prior to the heat treatment.
3. The process of claim 2 with the duration of the heat treatment in a range from 10 to 60 minutes.
4. The process of claim 2 with light-sensitive, toned layer containing a plasticizer.
5. The process of claim 2 with the light-sensitive, tonable layer containing a dihydropyridine compound.
6. The process of claim 2 with the light-sensitive, tonable layer containing a 2'-nitrophenyl-dihydropyridine derivative.
7. The process of claim 2 with the light-sensitive, tonable layer is treated after each toning step with a strong acid.
8. The process of claim 2 with the light-sensitive, tonable layer containing an ester of a polyfunctional carboxylic acid or alcohol as a plasticizer.
9. The process of claim 2 with the toner containing a cellulose acetate, poly-alpha-methyl styrene or polymethyl methacrylate as a binder.
10. The process of claim 2 with toning accomplished by contact with a transfer layer carrying the toner.
11. The process of claim 2 with the exposed and toned layer treated with a solvent after the heat treatment.
12. The process of claim 11 with acetone, butanone, or dichloromethane used as the solvent.
13. The process of claim 11 with the treatment accomplished with a vapor phase of the solvent.
14. The process of claim 2 with the light-sensitive, toned layer exposed overall through a support before the heat treatment.

* * * * *